(12) United States Patent
Jiang et al.

(10) Patent No.: US 9,053,900 B2
(45) Date of Patent: Jun. 9, 2015

(54) APPARATUS AND METHODS FOR HIGH-RESOLUTION ELECTRON BEAM IMAGING

(75) Inventors: Xinrong Jiang, Palo Alto, CA (US); Liqun Han, Pleasanton, CA (US)

(73) Assignee: KLA-Tencor Corporation, Milpitas, CA (US)

(*) Notice: Subject to any disclaimer, the term of this patent is extended or adjusted under 35 U.S.C. 154(b) by 72 days.

(21) Appl. No.: 13/438,543

(22) Filed: Apr. 3, 2012

(65) Prior Publication Data
US 2013/0256530 A1 Oct. 3, 2013

(51) Int. Cl.
*G21K 5/04* (2006.01)
*H01J 37/153* (2006.01)
*H01J 37/05* (2006.01)
*H01J 37/28* (2006.01)

(52) U.S. Cl.
CPC .............. *H01J 37/153* (2013.01); *H01J 37/05* (2013.01); *H01J 37/28* (2013.01); *H01J 2237/1534* (2013.01)

(58) Field of Classification Search
CPC ................ H01J 2237/24485; H01J 2237/057; H01J 37/147; H01J 37/153; H01J 37/141; H01J 2237/12; H01J 2237/14; H01J 2237/1516; H01J 2237/0492; H01J 2237/055; H01J 2237/153
USPC ........... 250/306, 307, 310, 311, 492.1, 492.2, 250/492.3, 396 R, 396 ML, 397, 398, 399
See application file for complete search history.

(56) References Cited

U.S. PATENT DOCUMENTS

| | | | |
|---|---|---|---|
| 3,979,890 A | 9/1976 | Schenk | |
| 5,444,243 A | 8/1995 | Kohhashi et al. | |
| 5,616,920 A | 4/1997 | Plies | |
| 6,111,253 A | 8/2000 | Tsuno | |
| 6,184,526 B1 * | 2/2001 | Kohama et al. | 250/310 |
| 6,407,384 B1 | 6/2002 | Tanaka et al. | |
| 6,717,141 B1 | 4/2004 | Rouse et al. | |
| 6,949,745 B2 | 9/2005 | Yonezawa | |
| 7,560,691 B1 | 7/2009 | Gubbens | |

(Continued)

FOREIGN PATENT DOCUMENTS

| | | |
|---|---|---|
| EP | 0 989 584 A1 | 3/2000 |
| EP | 1 610 358 A1 | 12/2005 |

(Continued)

OTHER PUBLICATIONS

PCT International Search Report and Written Opinion of the International Searching Authority for Application No. PCT/US2013/034999, Jun. 28, 2013, 12 sheets.

*Primary Examiner* — Nicole Ippolito
*Assistant Examiner* — Hanway Chang
(74) *Attorney, Agent, or Firm* — Okamoto & Benedicto LLP

(57) ABSTRACT

One embodiment relates to an apparatus for high-resolution electron beam imaging. The apparatus includes an energy filter configured to limit an energy spread of the electrons in the incident electron beam. The energy filter may be formed using a stigmatic Wien filter and a filter aperture. Another embodiment relates to a method of forming an incident electron beam for a high-resolution electron beam apparatus. Another embodiment relates to a stigmatic Wien filter that includes curved conductive electrodes. Another embodiment relates to a stigmatic Wien filter that includes a pair of magnetic yokes and a multipole deflector. Other embodiments, aspects and features are also disclosed.

13 Claims, 6 Drawing Sheets

(56) References Cited

U.S. PATENT DOCUMENTS

| | | |
|---|---|---|
| 7,755,043 B1 | 7/2010 | Gubbens |
| 7,821,187 B1 | 10/2010 | Jiang et al. |
| 7,863,580 B2 | 1/2011 | Hatakeyama et al. |
| 8,035,082 B2 | 10/2011 | Yamazaki et al. |
| 8,067,732 B2 | 11/2011 | Nakasuji et al. |
| 2008/0173814 A1* | 7/2008 | Watanabe et al. ............ 250/310 |
| 2009/0218506 A1* | 9/2009 | Nakasuji et al. ....... 250/396 ML |
| 2011/0114838 A1 | 5/2011 | Han et al. |

FOREIGN PATENT DOCUMENTS

| | | |
|---|---|---|
| JP | 05-054853 A | 3/1993 |
| JP | 05-275057 A | 10/1993 |
| JP | 06-103946 A | 4/1994 |

* cited by examiner (Reference conditions)

(energy filter applied to incident electron beam)

APPARATUS AND METHODS FOR HIGH-RESOLUTION ELECTRON BEAM IMAGING

BACKGROUND OF THE INVENTION

1. Field of the Invention

The present invention relates to apparatus and methods for electron beam imaging.

2. Description of the Background Art

Electron beam imaging systems typically use an electron beam column to scan an electron beam across a region of a substrate surface to obtain image data. The present disclosure provides novel and inventive apparatus and methods for high-resolution electron beam imaging.

SUMMARY

One embodiment relates to an apparatus for high-resolution electron beam imaging. The apparatus includes an energy filter configured to limit an energy spread of the electrons in the incident electron beam. The energy filter may be formed using a stigmatic Wien filter and a filter aperture.

Another embodiment relates to a method of forming an incident electron beam for a high-resolution electron beam apparatus. The method includes limiting an energy spread of the electrons in the incident electron beam using an energy filter.

Other embodiments relate to a stigmatic Wien filter. In one embodiment, the stigmatic Wien filter includes two pairs of magnetic cores and two pairs of curved electrodes. In another embodiment, the stigmatic Wien filter may include two pairs of magnetic yokes and a multipole deflector.

Other embodiments, aspects and features are also disclosed.

DETAILED DESCRIPTION

Figure 1:
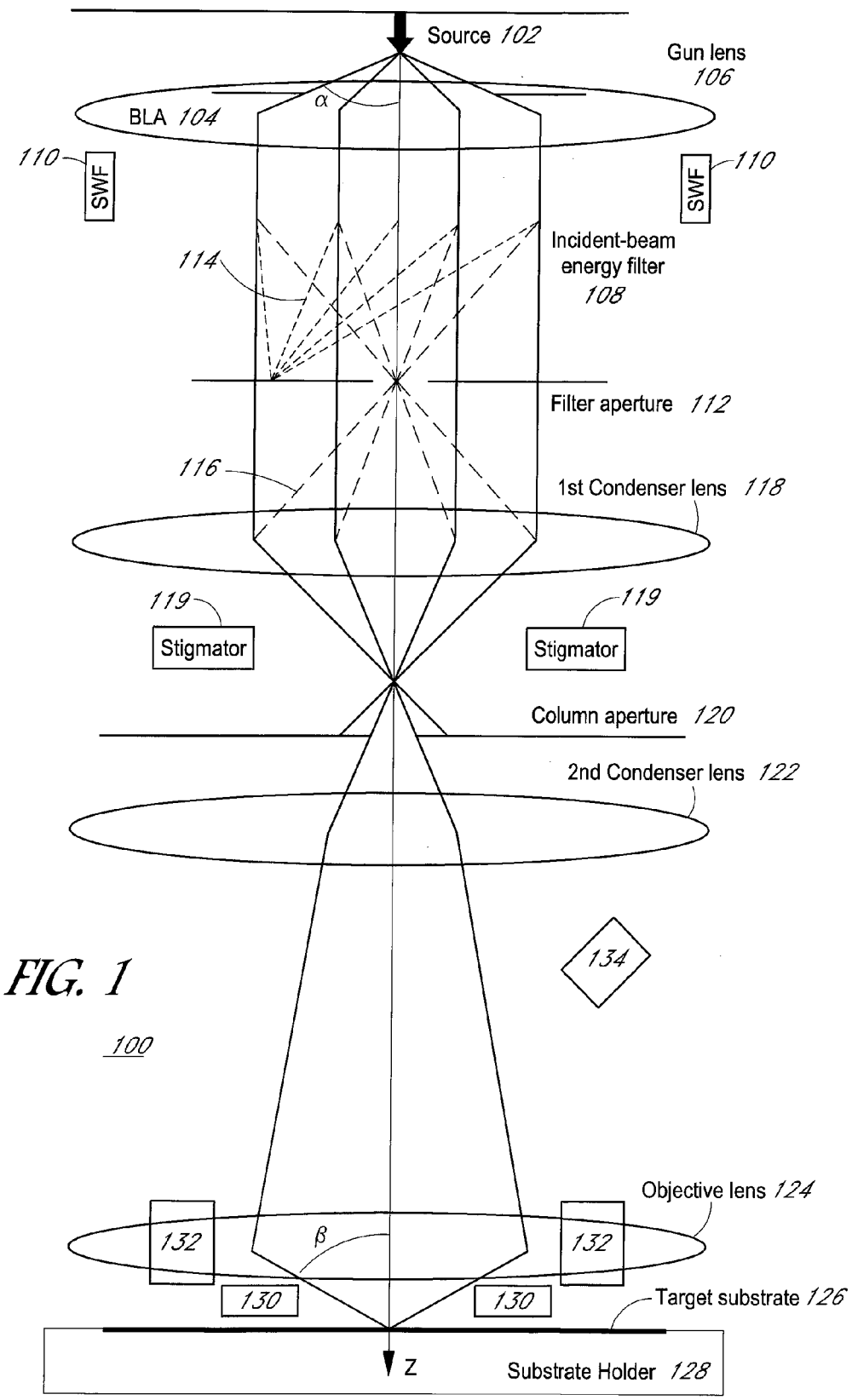
FIG. 1 is a cross-sectional view depicting an implementation of an electron beam column in accordance with an embodiment of the invention.

FIG. 1 is a cross-sectional view depicting an implementation of an electron beam column 100 in accordance with an embodiment of the invention. The components of the electron beam column 100 may be housed in one or more vacuum chambers.

As shown in FIG. 1, the electron beam column 100 may include, among other components, an electron gun system which includes an electron source 102, a gun lens 106, and a beam limiting aperture (BLA) 104. The electron source 102 may include a cathode which emits electrons that are accelerated through an opening in an anode. The BLA 104 limits the angle of the emitted electrons to the source emission angle α, and the gun lens 106 focuses the emitted electrons that pass through the BLA 104 so as to form the incident electron beam. The gun lens 106 is generally configured below the beam-limiting aperture 104 and is typically an electrostatic lens, though it may be a magnetic lens in alternate embodiments. In one embodiment, the electron beam that is generated by the electron gun system is a telecentrically-illuminating electron beam.

In accordance with an embodiment of the invention, the electron beam column 100 may further include an incident-beam energy filter 108. As described further below, such an incident-beam energy filter 108 may be advantageously used to substantially reduce the total spot size of the electron beam on the target substrate.

In one embodiment, as shown in FIG. 1, the incident-beam energy filter 108 may be implemented using a stigmatic Wien filter (SWF) 110 in combination with an energy filter aperture (filter aperture) 112. The electron beam from the electron gun system is focused onto the filter aperture 112 by the SWF 110. The electrons with energies within a small energy spread (for example, $\Delta E < 50$ meV) are influenced in a balanced manner by the electrostatic and magnetic forces of the SWF 110 such that they travel along the optical axis of the column 100. However, the electrons with energies outside of the small energy spread (for example, greater than 50 meV from the mean energy of the beam) are deflected by the SWF 110 due to the difference of deflection capabilities between the electrostatic and magnetic forces for different beam energies. The deflected electrons with energies outside of the small energy spread are blocked by the energy filter aperture 112. In other words, the SWF 110 may be configured to deflect electrons 114 having energies outside of a small range of energies such that they are blocked by the energy filter aperture 112 while allowing electrons 116 having energies within the small range of energies to pass through the energy filter aperture 112.

The beam crossover at the energy filter aperture 112, which is formed by the SWF 110, becomes the object of a first condenser lens 118. The beam current after the energy filter aperture 112 may be further selected by a column aperture 120. The beam passing through the column aperture 120 may then be focused by a second condenser lens 122. The objective lens 124 may then further focus the beam so as to converge the energy-filtered electron beam at a convergent angle β to form a beam spot on the target substrate 126. A substantial difference between the image formation of the column 100 in FIG. 1 and a conventional column is that the electron density is substantially reduced below the filter aperture 112 due to less beam current in a same or similar volume.

In addition, a beam stigmator 119 may be configured to compensate or correct for stigmatism which may have been introduced by the SWF 110. The compensation preferably results in an astigmatic (i.e. round) beam spot at the target substrate 126. In one implementation, the stigmator 119 may be configured between the first condenser lens 118 and the column aperture 120. Furthermore, an electrostatic lens 130 may be configured between the objective lens 124 and the target substrate 126, and a Wien filter 132 may be configured within the objective lens 124.

The target substrate 126 may be held by a movable stage 128. The target substrate 126 may be a semiconductor wafer being manufactured or a reticle for lithography. The movable stage 128 may be used to translate the target substrate 126 under column during an automated inspection or review process, for example.

The impingement of the incident electron beam onto the surface of the target substrate 126 causes emission of secondary and/or backscattered electrons. These secondary and/or backscattered electrons may be referred to herein as scattered electrons. The scattered electrons may be extracted by electrostatic lens 130 and pass back up through the column. The Wien filter 132 may deflect the scattered electrons so that their trajectory is at an angle with respect to the optical axis of the column. The off-axis scattered electrons may travel to the detection system 134 which may generate a detection signal based on the detected electrons.

Figure 2:
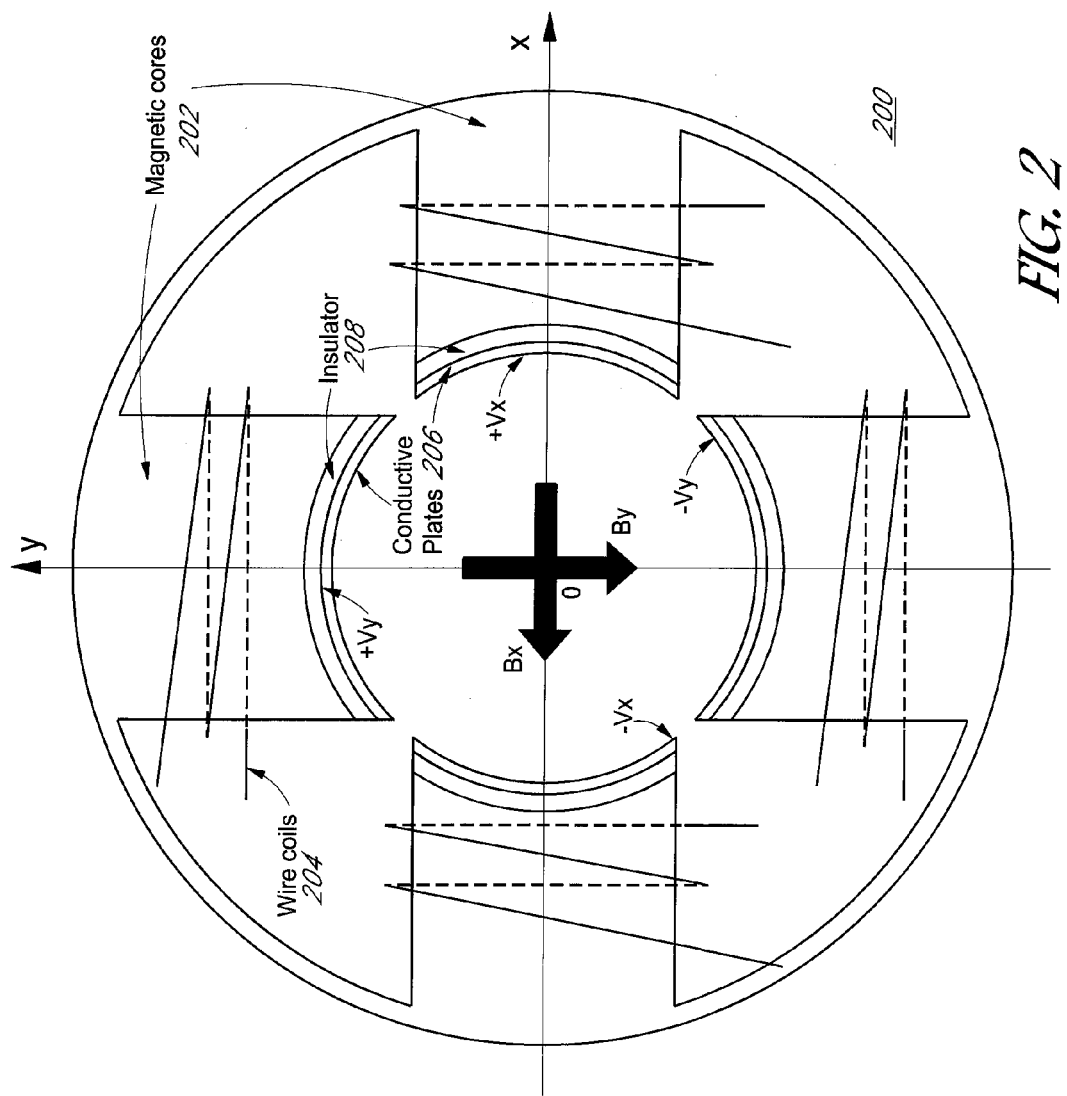
FIG. 2 is a top-down view of a first implementation of a stigmatic Wien filter in accordance with an embodiment of the invention.

FIG. 2 is a top-down view of a first implementation of a stigmatic Wien filter 200 in accordance with an embodiment of the invention. The stigmatic Wien filter 200 may be used in the electron beam column 100 described above in relation to FIG. 1.

The stigmatic Wien filter 200 may include two pairs of magnetic cores (magnetic pole pieces) 202. A first pair of cores 202 may be aligned on the x-axis, and a second pair of cores 202 may be aligned on the y-axis, where the z-axis is the optical axis of the electron beam column 100. Conductive Wien coils 204 may be wound around each magnetic core 202. The magnetic fields along the x and y axes in the Wien filter 200 may be controllably adjusted by adjusting the electrical current flowing through the coils 204.

In addition, the stigmatic Wien filter 200 may include two pairs of cylindrically-curved conductive plates 206. A first pair of cylindrically-curved plates 206 may be aligned on the x-axis, and a second pair of cylindrically-curved plates 206 may be aligned on the y-axis, where the z-axis is the optical axis of the electron beam column 100. As shown in FIG. 2, the plates 206 may be cylindrically curved and positioned so as to define an empty cylindrical space about the optical axis of the column.

As further shown in FIG. 2, insulators 208 may separate the plates 206 from the magnetic cores 202. The insulators 208 may have a curvature corresponding to the cylindrical-curvature of the plates 206. The surfaces of the magnetic cores 202 that abuts the insulators 208 may also have a cylindrical-curvature corresponding to the cylindrical-curvature of the plates 206.

In one implementation, the plates 206 may be metal coatings on the insulators 208 or thin cylindrically-curved pieces fixed onto the insulators 208. In addition, the height of the magnetic pole pieces 202 in the z-direction is preferably configured to be the same as the height of the electrostatic deflection plates 206. As such, if the thicknesses of the insulators 208 and the deflection plates 206 are sufficiently small, then the distribution of the electrostatic field along the z-axis may be configurable to match or nearly match the distribution of the magnetic field along the z-axis. The size of the gap between the deflection plates 206 is not critical, though the gap should be sufficiently large to avoid arcing between the plates 206.

The electrostatic fields along the x and y axes in the Wien filter 200 may be controllably adjusted by adjusting the electrical voltages applied to the plates 206. As shown, +Vx volts may be applied to the plate 206 which is arranged to be on the positive x-axis, −Vx volts may be applied to the plate 206 which is arranged to be on the negative x-axis. Similarly, +Vy volts may be applied to the plate 206 which is arranged to be on the positive y-axis, −Vy volts may be applied to the plate 206 which is arranged to be on the negative y-axis.

In accordance with an embodiment of the invention, the electrostatic and magnetic fields around the polar angle within the Wien filter 200 is not identical such that the Wien filter 200 is stigmatic. This differs from a conventional application of a Wien filter which balances the strengths of the electrostatic and magnetic fields only in one direction in order to, for instance, split secondary electrons from primary electrons.

Figure 3:
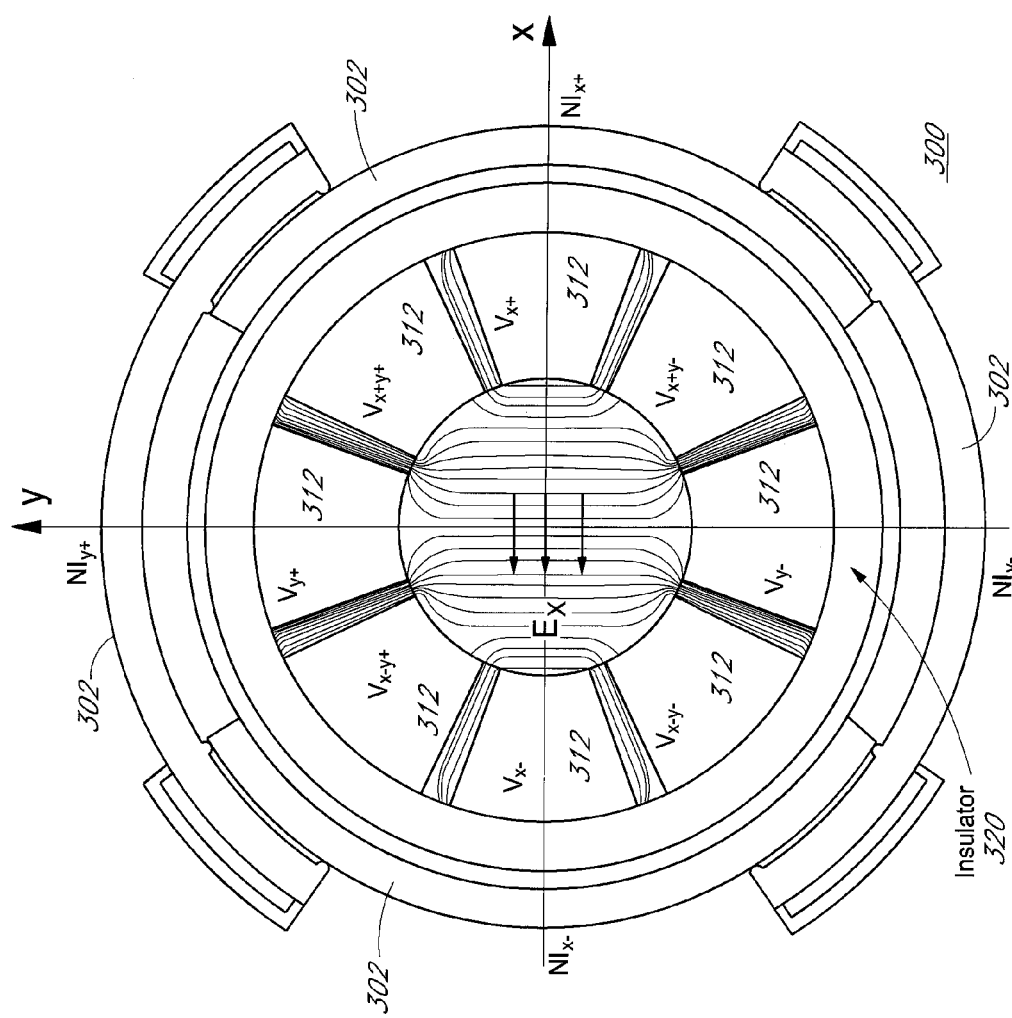
FIG. 3 is a top-down view of a second implementation of a stigmatic Wien filter with two pairs of magnetic saddle yokes in accordance with an embodiment of the invention.

FIG. 3 is a top-down view of a second implementation of a stigmatic Wien filter with two pairs of magnetic saddle yokes in accordance with an embodiment of the invention. The stigmatic Wien filter 300 may be used in the electron beam column 100 described above in relation to FIG. 1.

The stigmatic Wien filter 300 may include two pairs of magnetic saddle yokes 302. A first pair of magnetic saddle yokes 302 may be aligned on the x-axis, and a second pair of yokes 302 may be aligned on the y-axis, where the z-axis is the optical axis of the electron beam column 100.

Conductive coils may be wound N times around the yokes 302 so as to implement the ampere-turns Nlx+, Nlx−, Nly+, and Nly−, where N is the number of turns of the coils, and the electrical current strengths are represented by Ix+, Ix−, Iy+ and Iy−. The magnetic fields along the x and y axes within the Wien filter 300 may be controllably adjusted by adjusting the electrical current flowing through the coils. In addition, the stigmatic Wien filter 300 may include a multi-pole electrostatic deflector for creating a uniform deflection field. For example, as illustrated in FIG. 3, the multi-pole electrostatic deflector may be an octupole (8-pole) deflector, in which a uniform deflection field is created by applying specifically-defined voltages on the plates of the deflector. Alternative embodiments may use a 12-pole or 20-pole deflector, in which a uniform deflection field is created by specifically-defined angles of the deflector plates. The octupole deflector depicted in FIG. 3 includes four pairs of electrodes (or plates). A first pair of electrodes 312 (with applied voltages Vx+ and Vx−) may be aligned on the x-axis, and a second pair of electrodes 312 (with applied voltages Vy+ and Vy−) may be aligned on the y-axis, where the z-axis is the optical axis of the electron beam column 100. In addition, a third pair of electrodes 312 (with applied voltages Vx+y+ and Vx−y−) may be centered on the 45 degree angle line which cuts through the first quadrant (between the positive x and the positive y axes) and the third quadrant (between the negative x and negative y axes), and a fourth pair of electrodes 312 (with applied voltages Vx−y+ and Vx+y−) may be centered on the 135 degree angle line which cuts through the second quadrant (between the negative x and positive y axes) and the fourth quadrant (between the positive x and negative y axes). Insulator material 320 may separate the electrodes 312 from the magnetic saddle yokes 302.

In one embodiment, the control circuitry for applying voltages to the electrodes may be configured to implement two deflectors: a first deflector to control the amount of deflection in the x-direction; and a second deflector to control the amount of deflection in the y-direction. The relative strengths of the voltages applied on the plates of the octupole for the first (x-direction) deflector are shown in Table 1 below.

TABLE 1

| Octupole Plates | Vy+ | Vx-y+ | Vx+y+ | Vx+ | Vx- | Vx+y- | Vx-y- | Vy- |
|---|---|---|---|---|---|---|---|---|
| Relative voltage strength | 0 | $-1/\sqrt{2}$ | $1/\sqrt{2}$ | +1 | -1 | $1/\sqrt{2}$ | $-1/\sqrt{2}$ | 0 |

With the voltages on the plates in Table 1, a computer-simulated equipotential lines for the x-axis-aligned deflection field $E_x$ are shown in FIG. 3, in which an excellent uniform field for the deflection in the central area is displayed. The relative strengths of the voltages applied on the plates of the octupole for the second (y-direction) deflector are shown in the Table 2 below.

TABLE 2

| Octupole Plates | Vx+ | Vx-y+ | Vx+y+ | Vy+ | Vy- | Vx+y- | Vx-y- | Vx- |
|---|---|---|---|---|---|---|---|---|
| Relative voltage strength | 0 | $-1/\sqrt{2}$ | $1/\sqrt{2}$ | +1 | -1 | $1/\sqrt{2}$ | $-1/\sqrt{2}$ | 0 |

Note that Tables 1 and 2 give the relative strengths of the voltages applied to achieve x and y deflections, respectively. To achieve a specific deflection in the x-direction, the relative strengths in Table 1 will be scaled (multiplied) by a first voltage level, where the magnitude of the first voltage level determines the magnitude of the deflection in the x-direction. To achieve a specific deflection in the y-direction, the relative strengths in Table 2 will be scaled (multiplied) by a second voltage level, where the magnitude of the second voltage level determines the magnitude of the deflection in the y-direction. The actual voltage applied to a particular electrode in the octupole is a linear combination of the first voltage level multiplied by the relative strength for that electrode in Table 1 plus the second voltage level multiplied by the relative strength for that electrode in Table 2. By controlling the first and second voltage level, a user may control the magnitude and direction of the electrostatic deflection.

In accordance with an embodiment of the invention, the electrostatic and magnetic fields around the polar angle within the Wien filter 300 are configured to be not identical in strength such that the Wien filter 300 is purposefully stigmatic. This differs from a conventional application of a Wien filter which balances the strengths of the electrostatic and magnetic fields only in one direction in order to, for instance, split secondary electrons from primary electrons.

Figure 4:
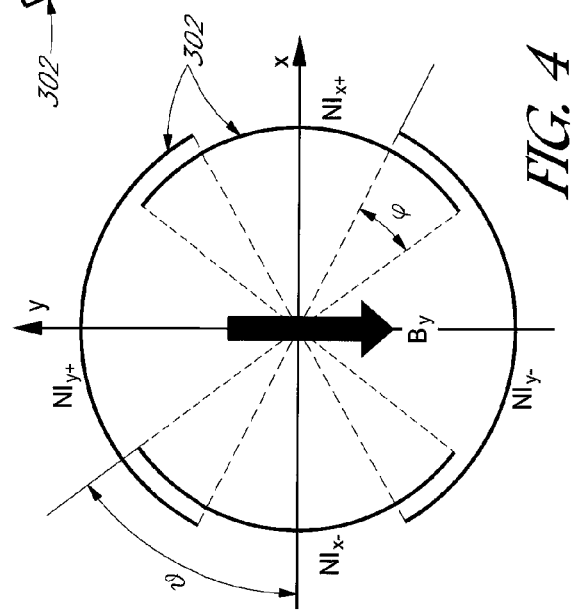
FIG. 4 shows angles of interest in relation to the two pairs of magnetic saddle yokes of the second implementation in accordance with an embodiment of the invention.

FIG. 4 shows angles of interest in relation to the two pairs of magnetic saddle yokes of the second implementation in accordance with an embodiment of the invention. As shown, each yoke 302 may span an angle 2θ that is greater than 90 degrees for more uniform distribution of the magnetic deflection field, such that there may be an overlap of angle φ (an azimuthal overlap) between adjacent yokes.

Figure 5:
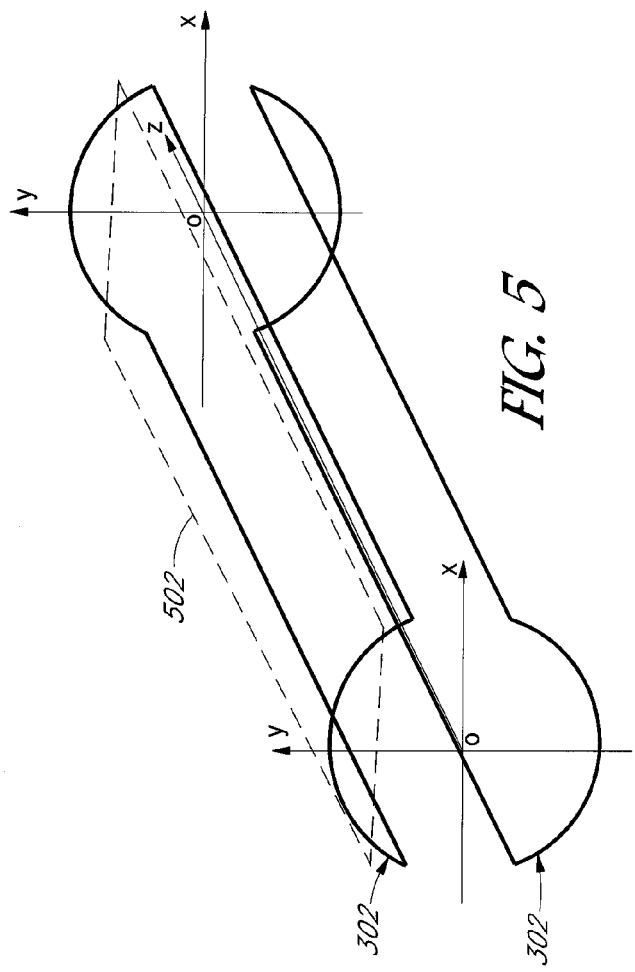
FIG. 5 is a perspective view of a pair of magnetic saddle yokes in accordance with an embodiment of the invention.

FIG. 5 is a perspective view of a pair of magnetic saddle yokes 302 in accordance with an embodiment of the invention. In this illustration, the pair of magnetic saddle yokes 302 are arranged so as to be have coil windings which provide the magnetic deflection field in the y-direction (By) for the stigmatic Wien filter 100. For purposes of clarity, the orientation of a winding of a coil on the top magnetic saddle yoke 302 is depicted by the dashed-line rectangle 502.

In an exemplary embodiment, the electron beam column 100 of FIG. 1 may be configured to be used in applications with relatively low beam currents. For example, beam currents of less than 1,000 picoamperes (pA) may be used for applications such as critical dimension-scanning electron microscopy (CD-SEM), electron beam review and/or hot spot wafer inspection. In an electron beam column operating at a low beam current, the electron-electron interactions is less dominant in determining total spot blur. Rather, lens aberrations play a greater role in limiting the resolution of the column.

The resolution of the electron beam column may be commonly broken down or expressed in terms of contributing e-beam spot blurs in the plane of the target substrate. These blurs include a source image $d_g$, the wavelength-dependent diffraction blur $d_\lambda$, the spherical aberration $d_s$, and the chromatic aberration $d_c$. Each of these blurs may be defined in a measurement of FW50 (the full width diameter in which 50% of the electrons are included). The total spot size, $d_{tot}$, which may be used to characterize the resolution, may be given by a square-root of square-summation. This is stated in equation form below.

$$d_{tot} = (d_g^2 + d_\lambda^2 + d_s^2 + d_c^2)^{1/2} \quad (Eq. 1)$$

In one implementation, the incident-beam energy filter 108 may be configured to select electrons from the source 102 within a small energy spread ΔE. The reduction in chromatic aberration is expected to be proportional to the energy filtering rate ρ. For example, the energy spread before filtering may be ΔE=1 electron volt (eV), and the energy spread after filtering may be ΔE=50 milli electron volts (meV) so as to achieve an energy filtering rate ρ=1 eV/50 meV=20. This is expected to result in a reduction of chromatic aberration ($d_c$) of 20 times.

Meanwhile, the source image is expected to increase in proportion to the square-root of the energy filtering rate ρ due to the loss of source brightness. For example, if ρ=20, then the source image $d_g$ is expected to increase by the square root of 20. While the size of the source image $d_g$ increase undesirably, applicants have determined that this is more than offset by the reduction in chromatic aberration. As such, the combined result is a substantial increase in resolution.

Note that, to balance blurs, the optimal convergent angle β becomes larger, while the diffraction blur $d_\lambda$ is small. In addition, for a given beam current after the energy filtering, the electron-electron interactions become fairly weak because of reduced electron density and so may be neglected. Note also that the spherical aberration $d_s$ is unchanged with and without energy-filtering and may be kept small so as to be negligible.

As described below in relation to FIGS. 6 and 7, the total spot size $d_{tot}$ is reduced by a factor of about one-half at a beam current of sub-nano-amperes (less than one nano-ampere) compared to $d_{tot}$ without energy filtering. In other words, the resolution may improve by a factor of about 2 times. For applications with an even lower beam current, the resolution improvement may be even larger (for example, greater than 3 times) because the source image is still less dominant after energy filtering. Furthermore, the resolution may be further improved by using a high-brightness gun in addition to the energy filtering, especially for relatively high beam currents.

Figure 6:
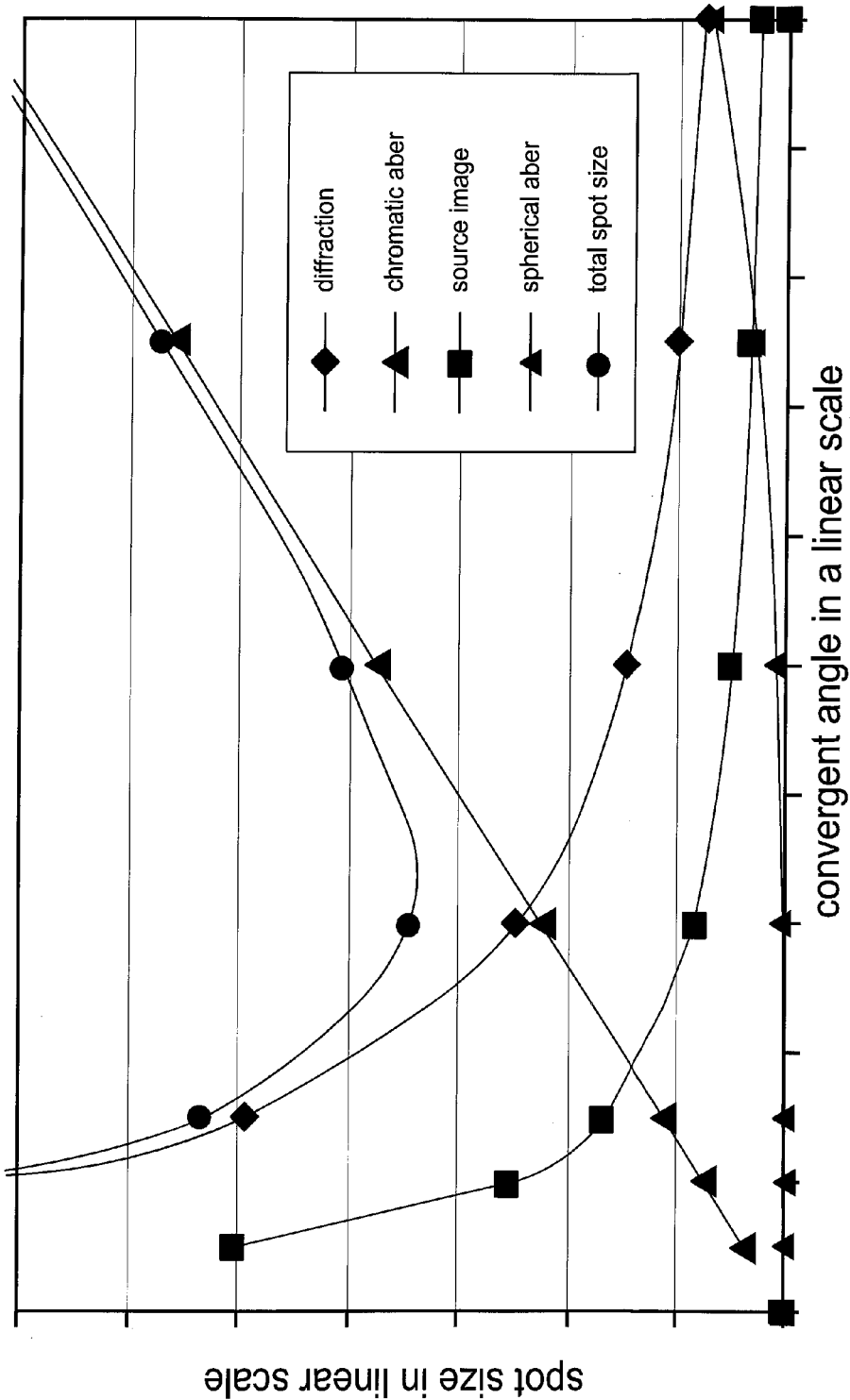
FIG. 6 is a graph of total spot size, and factors contributing thereto, as a function of convergent angle for a computer-simulated electron beam column under reference conditions.

FIG. 6 is a graph of total spot size, and factors contributing thereto, as a function of convergent angle for a computer-simulated electron beam column under reference conditions. The reference conditions are conventional in that there is no incident-beam energy filter being used. In other words, in FIG. 1, the incident-beam energy filter 108 (including the stigmatic Wien filter 110 and the filter aperture 112) and the compensating stigmator 119 are absent or inactive.

As discussed above, the factors contributing to the total spot size include diffraction, chromatic aberration (chromatic aber), the source image size (source image), and spherical aberration (spherical aber). As shown in FIG. 6, under reference conditions, diffraction and chromatic aberration are the primary contributing factors to the total spot size.

Figure 7:
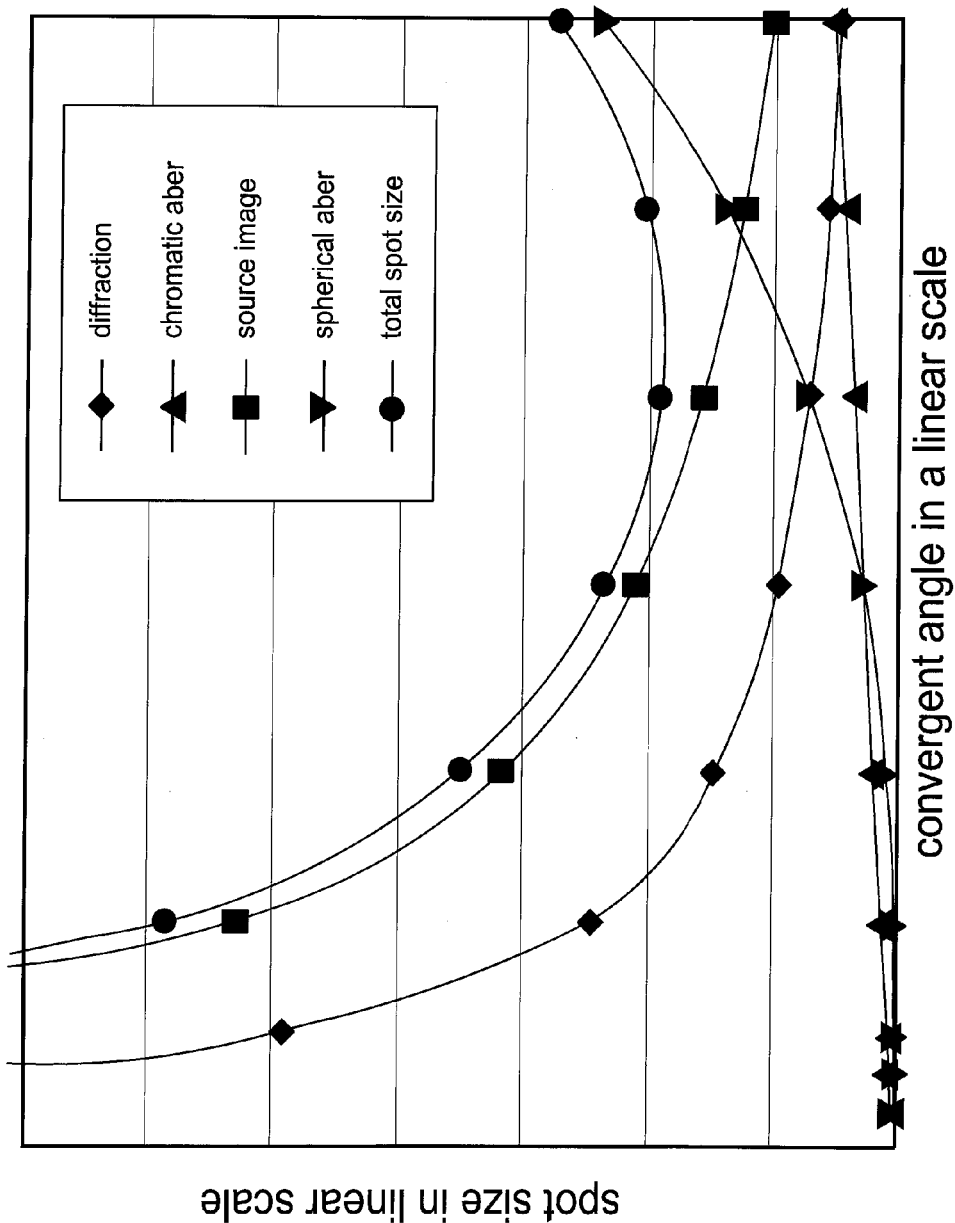
FIG. 7 is a graph of total spot size, and factors contributing thereto, as a function of convergent angle for a computer-simulated electron beam column with incident-beam energy filtering using a stigmatic Wien filter in accordance with an embodiment of the invention.

FIG. 7 is a graph of total spot size, and factors contributing thereto, as a function of convergent angle for a computer-simulated electron beam column with incident-beam energy filtering using a stigmatic Wien filter in accordance with an embodiment of the invention. In this case, an incident-beam energy filter 108 is configured as shown in FIG. 1 and is being actively used.

Again, the factors contributing to the total spot size include diffraction, chromatic aberration (chromatic aber), the source image size (source image), and spherical aberration (spherical aber). As shown in FIG. 7, the contribution due to the source image size is substantially increased. This is a conventional reason against using incident-beam energy filtering. However, as our simulations show, the contribution due to the chromatic aberration drops a relatively larger amount so as to more than offset the increase in source image size. As a result, at least for low-beam current applications, the minimum total spot size is substantially lower with the incident-beam energy filtering in accordance with the present disclosure. The scales of FIGS. 6 and 7 are the same. Hence, it is seen that the minimum total spot size with incident-beam energy filtering per FIG. 7 is substantially reduced compared to the minimum total spot size for the reference conditions per FIG. 6.

The apparatus and methods disclosed herein provide various substantial advantages over conventional apparatus and methods. First, a breakthrough improvement in resolution of about 2 to 3 times or more is achieved for applications in CD-SEM, review and/or inspection.

Second, the innovative use of a Wien-filter based energy filter for the incident electron beam allows the beam to travel in a straight path along the optical axis of the column. In contrast, other energy filter configurations, such as a magnetic prism with an electrostatic mirror analyzer, or a sector analyzer with an electrostatic field or a magnetic field, bend or curve the path of the electron beam in order to select the electrons within a low-energy spread. With the straight-axial configuration provided by the Wien-filter based energy filter, many technical risks and issues, such as alignment, for example, are avoided.

Third, unlike a retarding energy filter, the Wien-filter based energy filter does not require the deceleration of electrons in the beam in order to select electrons in the desired energy range. This avoids the increased electron-electron interactions that are caused by such a retarding field and, as a result, avoids additional energy spread caused by Boersch effects.

Fourth, electron-electron interactions in the lower portion of the column below the energy filter aperture are advantageously reduced. This is due to the reduction in electron density after the incident-beam energy filter.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for high-resolution electron beam imaging, the apparatus comprising:
    a source configured to emit electrons;
    a gun lens configured to focus the electrons from the source into an electron beam along an optical axis of the apparatus;
    a beam limiting aperture configured to limit a source emission angle of electrons in the electron beam;
    an energy filter configured to limit an energy spread of the electrons in the electron beam to form an energy-filtered electron beam having a reduced energy spread, wherein the energy filter comprises
        a Wien filter comprising
            first and second pairs of magnetic saddle yokes, wherein each magnetic saddle yoke of said first and second pairs of magnetic saddle yokes spans an angle greater than 90 degrees such that there is an azimuthal overlap between adjacent magnetic saddle yokes, and
            a multipole electrostatic deflector positioned between first and second magnetic saddle yokes of each said pair of magnetic saddle yokes within the Wien filter; and
        a filter aperture, wherein the electrons with energies outside of the reduced energy spread are deflected by the Wien filter so as to be blocked by the filter aperture while the electrons with energies within the reduced energy spread pass through the filter aperture;
    an objective lens configured to focus the energy-filtered electron beam onto a spot on a surface of a target substrate; and
    a detector configured to detect scattered electrons from the surface of the target substrate.

2. The apparatus of claim 1, wherein the first pair of magnetic saddle yokes is aligned with an x-axis, and the second pair of magnetic saddle yokes is aligned with a y-axis that is perpendicular to the x-axis, wherein both the x-axis and the y-axis are perpendicular to the optical axis, and wherein each magnetic saddle yoke of said first and second pairs of magnetic saddle yokes has a concave cylindrical face facing towards the optical axis.

3. The apparatus of claim 1, further comprising a stigmator to compensate for astigmatism introduced by the stigmatic Wien filter.

4. The apparatus of claim 3, wherein the stigmator is configured between the filter aperture and a column aperture.

5. An apparatus for high-resolution electron beam imaging, the apparatus comprising:
- a source configured to emit electrons;
- a gun lens configured to focus the electrons from the source into an electron beam along an optical axis of the apparatus;
- a beam limiting aperture configured to limit a source emission angle of electrons in the electron beam;
- an energy filter configured to limit an energy spread of the electrons in the electron beam to form an energy-filtered electron beam having a reduced energy spread, wherein the energy filter comprises
  - a stigmatic Wien filter of the energy filter, wherein the stigmatic Wien filter has unbalanced strengths of electrostatic and magnetic fields so as to be stigmatic, and the stigmatic Wien filter comprises
    - first and second pairs of magnetic saddle yokes, and
    - a multipole electrostatic deflector positioned within the stigmatic Wien filter in a space surrounded by said first and second pairs of magnetic saddle yokes;
  - a filter aperture, wherein the electrons with energies outside of the reduced energy spread are deflected by the stigmatic Wien filter so as to be blocked by the filter aperture while the electrons with energies within the reduced energy spread pass through the filter aperture;
- an objective lens configured to focus the energy-filtered electron beam onto a spot on a surface of a target substrate; and
- a detector configured to detect scattered electrons from the surface of the target substrate.

6. The apparatus of claim 5,
- wherein the first pair of magnetic saddle yokes in the energy filter are wound by conductive coils to produce a first magnetic field along a first direction perpendicular to the optical axis, and
- wherein the second pair of magnetic saddle yokes in the energy filter are wound by conductive coils to produce a second magnetic field along a second direction perpendicular to the optical axis and perpendicular to the first direction.

7. The apparatus of claim 6, wherein an applied voltage for each electrode of the multipole electrostatic deflector is a linear combination of a first voltage level multiplied by a relative strength of the electrode for deflections in the first direction and a second voltage level multiplied by a second relative strength of the electrode for deflections in the second direction.

8. The apparatus of claim 7, wherein the multipole electrostatic deflector is one of a group consisting of an octupole deflector, a 12-pole deflector, and a 20-pole deflector.

9. A method of forming an incident electron beam for a high-resolution electron beam apparatus, the method comprising:
- emitting electrons from a source;
- focusing the electrons from the source into an electron beam;
- limiting a source emission angle of electrons in the electron beam using a beam limiting aperture;
- reducing an energy spread of the electrons in the electron beam using an energy filter to form an energy-filtered electron beam having a reduced energy spread, wherein the energy filter comprises a Wien filter and a filter aperture, wherein the Wien filter comprises first and second pairs of magnetic saddle yokes and a multipole electrostatic deflector positioned in a space surrounded by said first and second pairs of magnetic saddle yokes, and wherein the electrons with energies outside of the reduced energy spread are deflected by the Wien filter so as to be blocked by the filter aperture while the electrons with energies within the reduced energy spread pass through the filter aperture; and
- focusing the energy-filtered electron beam onto a spot on a surface of a target substrate using an objective lens.

10. A method of forming an incident electron beam for a high-resolution electron beam apparatus, the method comprising:
- emitting electrons from a source;
- focusing the electrons from the source into an electron beam;
- limiting a source emission angle of electrons in the electron beam using a beam limiting aperture;
- reducing an energy spread of the electrons in the electron beam using an energy filter to form an energy-filtered electron beam having a reduced energy spread, wherein the energy filter comprises a Wien filter and a filter aperture, wherein the Wien filter comprises first and second pairs of magnetic saddle yokes and a multipole electrostatic deflector positioned between first and second magnetic saddle yokes of each said pair of magnetic saddle yokes within the Wien filter, and wherein the electrons with energies outside of the reduced energy spread are deflected by the Wien filter so as to be blocked by the filter aperture while the electrons with energies within the reduced energy spread pass through the filter aperture; and
- correcting astigmatism introduced by the energy filter before the energy-filtered electron beam is focused onto the spot on the surface of the target substrate;
- focusing the energy-filtered electron beam onto a spot on a surface of a target substrate using an objective lens.

11. The method of claim 10, wherein
- each yoke of the first pair of magnetic saddle yokes is wound by conductive coils to produce a first magnetic field in a first direction along a first axis,
- each yoke of the second pair of magnetic saddle yokes is wound by conductive coils to produce a second magnetic field in a second direction along the second axis, wherein the first and second pairs of magnetic saddle yokes are configured with an overlap, and
- an applied voltage for each electrode of the multipole deflector is a linear combination of a first voltage level multiplied by a relative strength of the electrode for deflections in the first direction and a second voltage level multiplied by a second relative strength of the electrode for deflections in the second direction.

12. A stigmatic Wien filter comprising:
- a multipole deflector;
- a first pair of magnetic saddle yokes having concave faces facing towards the multipole deflector and wound by conductive coils producing a first magnetic field in a direction of a first axis; and
- a second pair of magnetic saddle yokes having concave faces facing towards the multipole deflector and wound by conductive coils producing a second magnetic field in a direction of a second axis,
- wherein the first and second axes are perpendicular to each other and are also perpendicular to an optical axis, and
- further wherein the first and second pairs of magnetic yokes are configured with an overlap,
- further wherein the stigmatic Wien filter has unbalanced strengths of electrostatic and magnetic fields so as to be stigmatic.

13. The stigmatic Wien filter of claim 12, wherein an applied voltage for each electrode of the multipole deflector is a linear combination of a first voltage level multiplied by a relative strength of the electrode for deflections in the direction of the first axis and a second voltage level multiplied by a second relative strength of the electrode for deflections in the direction of the second axis.

* * * * *